United States Patent [19]

Chapin et al.

[11] Patent Number: 4,845,442
[45] Date of Patent: Jul. 4, 1989

[54] HIGH SPEED CURRENT LIMITING SENSE AMPLIFIER

[75] Inventors: Jay R. Chapin, Scarborough, Me.; Thomas M. Luich, Campbell, Calif.

[73] Assignee: National Semiconductor Corp., Santa Clara, Calif.

[21] Appl. No.: 206,012

[22] Filed: Jun. 13, 1988

[51] Int. Cl.$^4$ .............................................. H03F 3/68
[52] U.S. Cl. ................................... 330/310; 330/288; 307/530
[58] Field of Search ............... 307/530, 350, 362, 363; 323/315, 316; 330/51, 288, 310, 311

[56] References Cited

U.S. PATENT DOCUMENTS

| 4,215,282 | 7/1980 | Brown et al. | 307/530 X |
| 4,716,547 | 12/1987 | Baskett et al. | 307/530 X |
| 4,727,269 | 2/1988 | Luich | 307/530 |

Primary Examiner—Steven Mottola
Attorney, Agent, or Firm—Steven F. Caserza; Lee Patch

[57] ABSTRACT

According to the teachings of this invention, a novel sense amplifier is provided which includes a current steering transistor having its emitter connected to the collector of a current mirror transistor, its collector connected to the base of an output transistor, and its base driven by the input signal. With a low input signal, the emitter of the current steering transistor is pulled low, thereby pulling the base of the output transistor low. Conversely, when the input signal is high, and the current steering transistor ceases to operate in the active saturation mode and begins to operate in the inverse active saturation mode, thereby providing current from its base to its collector in order to turn on the output transistor.

11 Claims, 2 Drawing Sheets

HIGH SPEED CURRENT LIMITING SENSE AMPLIFIER

BACKGROUND OF THE INVENTION

This invention relates to integrated circuits, and more specifically to a high speed, low power sense amplifier.

Sense amplifiers are well known in the art. The function of a sense amplifier is to sense the logical level of a binary input signal, and provide an output signal having a logical state determined by the input signal, where the output signal meets certain voltage and current standards, such as transistor-transistor logic (TTL) levels. The input signal is provided, for example, from a memory array or a logic array within an integrated circuit.

It is, of course, highly desirable to manufacture integrated circuits which are small, switch rapidly, and consume low power. One example of a prior art sense amplifier is shown in the schematic diagram of FIG. 1. Sense amplifier 100 includes input terminals 101-1 through 101-8 for receiving input signals from, for example, eight programmable AND gates in a programmable logic array (not shown). Sense amplifier 100 also includes output terminal 102 for providing an output signal having a logical level determined by the logical level of the input signals. Circuit 100 also includes power supply terminal 103 and a biasing circuit consisting of NPN transistor 106 having its base connected to its collector, thereby serving as a load device, and resistor 105 and diode 104, all connected in series between power supply terminal 103 and ground. Circuit 100 also includes transistors 110a and 110b which have their collectors, bases, and emitters connected in common, respectively. In this manner, transistors 110a and 110b function as a single transistor having twice the emitter area of a single one of transistors 110a and 110b. Since the emitters of transistors 110a and 110b are connected to ground, as is the emitter of transistor 106, and the bases of transistors 110a, 110b, and 106 are connected together, the base-emitter voltages of transistors 106, 110a, and 110b are equal. Thus, the biasing current flowing through the collector of transistor 106 is "mirrored" by transistors 110a and 110b, causing transistors 110a and 110b to always try to draw collector current.

Circuit 100 also includes output transistor 112 having its emitter connected to ground, its collector connected to output terminal 102, and its base connected to the collectors of transistors 110a and 110b. Resistor 111 connects supply terminal 103 to the collector of output transistor 112.

Input terminals 101-1 through 101-8 are connected to the bases of transistors 107-1 through 107-8, which have their collectors and emitters connected in common to operate as an OR gate. The collectors of transistors 107-1 through 107-8 are connected to power supply terminal 103, and the emitters of transistors 107a through 107c are connected through diode 108 and resistor 109 to the collectors of transistors 110a and 110b.

In this circuit, input voltage $V_{IN}$ applied to each of input terminals 101-1 through 101-8 is low when $V_{IN}$ is less than or equal to $$V_{LOW} = V_{be\,101} + V_{be\,108} + V_{be\,112} + V_{109};$$

where $V_{be\,101}$ is the base emitter voltage drop of transistors 101-1 through 101-8, approximately 0.8 volts;

$V_{be\,108}$ is the forward biased voltage drop across diode 108, approximately 0.8 volts;

$V_{be\,112}$ is the base-emitter voltage drop of output transistor 112, approximately 0.8 volts; and $V_{109}$ is the voltage drop across resistor 109, typically about 0.3 volts, or $V_{LOW} \approx 2.7$ volts.

With $V_{IN} = V_{LOW}$ applied to each input terminal 101-1 through 101-8, output transistor 112 is turned off, although with $V_{IN}$ greater than about $V_{be\,101} + V_{be\,108} + V_{sat\,110b}$ of 1.8 volts (where $V_{sat\,110b}$ is the collector-emitter voltage of transistors 110a and 110b when saturated) current still flows through input transistors 101-1 through 101-8, diode 109, resistor 109, and transistors 110a, 110b.

To assure that transistors 110a and 110b are saturated when $V_{IN} = V_{LOW}$ such that their collector voltages are less than that voltage required to forward bias the base-emitter junction of output transistor 112, it is necessary that the current provided by resistor 109 be as low as possible. The current through resistor 109 is determined by the level of input signal applied to input terminals 101-1 through 101-8, and the resistance value of resistor 109.

When the input signal $V_{IN}$ applied to one or more of input terminals 101-1 through 101-8 rises above 3 base-emitter voltage drops (transistors 107-1 through 107-8, diode 108, and transistor 112), the voltage drop across resistor 109 increases and tracks the input signal, such that $$V_{109} = V_{IN} - 3V_{be};$$

where $V_{109}$ = the voltage across resistor 109;
$V_{IN}$ = the input voltage applied to input lead 101; and
$V_{be}$ = the base-emitter voltage drop of a transistor (typically 0.8 V).

The current through resistor 109 serves to provide the collector current through transistors 110a, 110b, and the base current to output transistor 112. With an input signal greater than $V_{LOW}$ applied to one or more input terminals 101-1 through 101-8, transistors 110a, 110b are no longer saturated, but are operating in the linear active mode. Furthermore, the base of output transistor 112 is being driven by current made available from resistor 109, transistor 112 is turned on, and output terminal 102 is pulled low to $V_{sat\,112}$, the collector-emitter voltage of transistor 112 when saturated.

When the input signal applied to one or more input terminals 101-1 through 101-8 makes a transition from a low level (less than or equal to $V_{LOW}$) to a high level (greater than $V_{LOW}$), the change in input voltage over time (dv/dt) is reflected by a corresponding change in current flow through resistor 109 with respect to time (di/dt). This has the disadvantage of an incremental current per unit time delay. In other words, the current available from a resistor is limited by the voltage drop across the resistor. Initially the current available is low in the early part of the input signal transition and is limited by the final input signal high level voltage. Thus, the prior art circuit of FIG. 1 has the disadvantage that the high-to-low transition of the output signal on output terminal 102 is dependent on the slew rate of the low-to-high input signal applied to one or more input terminals 101-1 through 101-8. Also, the base of output transistor 112 is connected directly to the collectors of transistors 110a, 110b, requiring the collectors of transistors 110a, 110b to discharge the base capacitance of output transistor 112.

One way of causing the prior art circuit of FIG. 1 to more rapidly discharge the base capacitance of transistor 112 is to increase the current flow through diode 104, resistor 105, and transistor 106, thereby causing the mirrored current through transistors 110a, 110b to increase. In this event, in order to maintain the same input threshold voltage, the resistance value of resistor 109 must decrease. With a decreased resistance of resistor 109, the dependence of the high-to-low transition of the output signal and output terminal 102 is less dependent on the slew rate of the low-to-high transition of an input signal. However, this has the disadvantage of increasing the power consumption of the circuit of FIG. 1.

FIG. 2 shows a schematic diagram of another prior art sense amplifier circuit. Components which perform similar functions as the components in the prior art circuit of FIG. 1 are numbered similarly. Sense amplifier 200 includes level shift diode 209 in place of resistor 109 of the circuit of FIG. 1, pedestal diode 215 connected between the emitter of output transistor 212 and ground, diode 214 having its anode connected to the base of output transistor 212 and its cathode connected to the collectors of transistors 210a and 210b, and resistor 213 connected between power supply terminal 203 and the base of transistor 212.

The operation of output transistor 212 in the circuit of FIG. 2 is independent of the slew rate of the input signal. When the input signal has risen high enough to turn off diode 214, the current through resistor 213 is switched substantially instantaneously to the base of transistor 212.

The addition of resistor 213 provides pull up for the base of output transistor 212 when output transistor 212 switches on in response to a low to high transition of the input signal. However, including resistor 213 makes the discharge of the base of output transistor 212 more difficult when transistor 212 turns off in response to a high to low transition of the input signal. Diode 214 prevents current from diodes 208, 209 from flowing to the base of transistor 212, thereby limiting the base drive of transistor 212 to the maximum current allowed by resistor 213. Pedestal diode 215 raises the base turn-off voltage of output transistor 212 in order to adjust for the presence of diode 214.

As with the prior art circuit of FIG. 1, sense amplifier 200 of FIG. 2 requires the collectors of transistors 210a, 210b to discharge the base capacitance of output transistor 212. Furthermore, transistors 210a, 210b of FIG. 2 also have to handle the additional current provided by resistor 213. As with sense amplifier 100 of FIG. 1, sense amplifier 200 of FIG. 2 can increase its switching speed by increasing the current flow through transistors 210a, 210b, thereby allowing transistors 210a, 210b to more rapidly discharge the base capacitance of output transistor 212. This requires the current flowing through diode 204, resistor 205, and transistor 206 to be increased, thereby increasing the current mirrored by transistors 210a, 210b. However, this has the deleterious effect of increasing the power consumption of sense amplifier 200.

The turn-on of output transistor 212 can also be increased by decreasing the resistance value of resistor 213. However, this would require the current flow through transistor 206, and thus the current mirrored by transistors 210a, 210b, to be increased, in order to consume the additional current divided by resistor 213 when output transistor 212 is to be turned off. This of course increases the power consumption of circuit 200.

FIG. 3 depicts another prior art circuit in which resistor 320 is connected to VCC through terminal 303. In this circuit, current is always supplied by resistor 320 to the base of transistor 321, and this current is supplied either to the emitter of transistor 321 and sunk via transistor 310 in response to a low input signal applied to input terminal 301, or to the collector of transistor 321, or turning on the base of output transistor 312, in response to a high input signal applied to input terminal 301. While the circuit of FIG. 3 operates in the same manner as the circuit of FIG. 2, the circuit of FIG. 3 has the disadvantage of always providing current through resistor 320, thereby having a relatively high power consumption.

SUMMMARY OF THE INVENTION

According to the teachings of this invention, a novel sense amplifier is provided which includes a current steering transistor having its emitter connected to the collector of a current mirror transistor, its collector connected to the base of an output transistor, and its base driven by the input signal. With a low input signal, the emitter of the current steering transistor is pulled low, thereby pulling the base of the output transistor low, drawing all base-collector Schottky feed around current to the emitter of the current mirror transistor, thereby preventing the output transistor from turning on. Conversely, when the input signal is high, the base-emitter junction of the current steering transistor turns on and thus the base-collector Schottky feed around current from the current steering transistor is available to drive the base of the output transistor.

In one embodiment, the invention includes an input terminal for receiving an input signal, an output terminal for providing an output signal as a function of the input signal, output transistor means having a first current handling lead coupled to the output terminal, a second current handling lead coupled to a voltage supply, and a control lead, and means for actively discharging the control lead in response to an input signal of a first state, thereby causing the output transistor means to switch and causing the output signal to switch to a desired state in response to the input signal, wherein the means for actively discharging comprises a discharge transistor having a first current handling lead coupled to the control lead of the output transistor means, a second current handling lead coupled to a current source, and a control lead which receives a control signal as a

DETAILED DESCRIPTION

Figure 1:
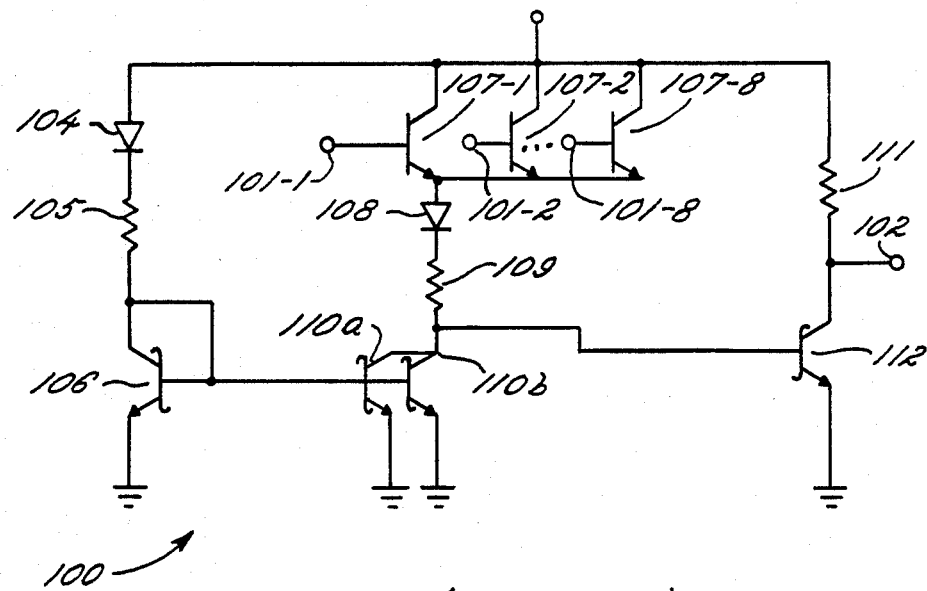
FIG. 1 is a schematic diagram of a prior art sense amplifier.
Figure 2:
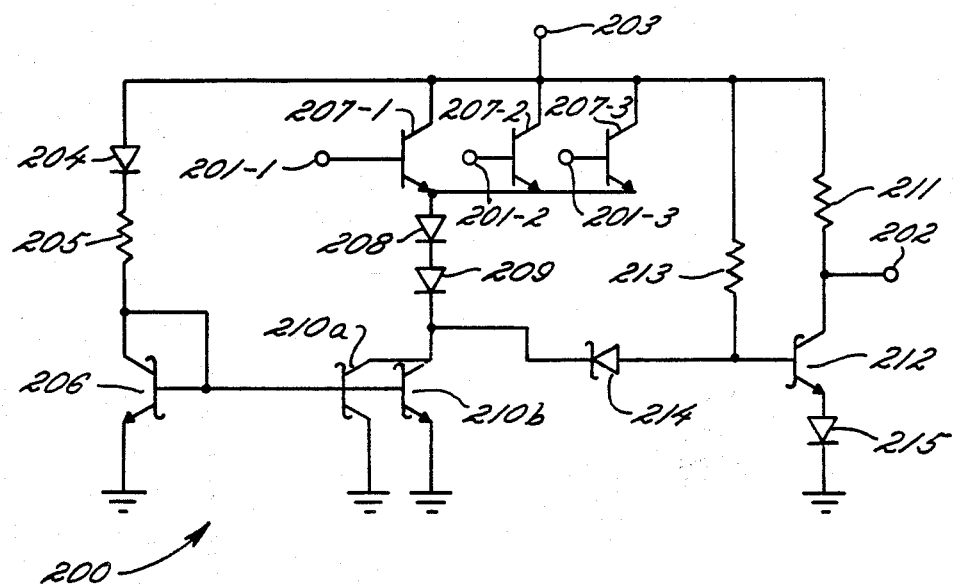
FIG. 2 is a schematic diagram of another prior art sense amplifier.
Figure 4:
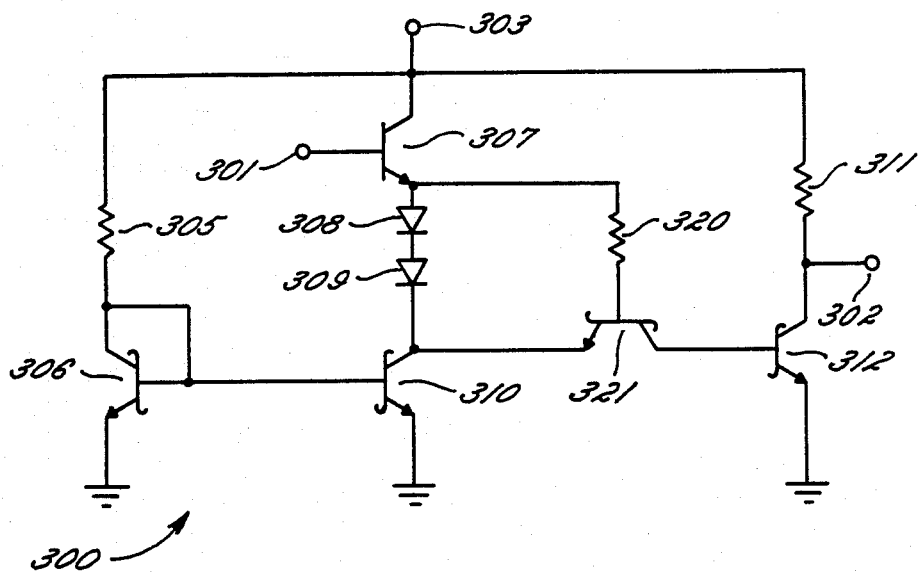
FIG. 4 is a schematic diagram of one embodiment of a sense amplifier constructed in accordance with the teachings of this invention.
Figure 3:
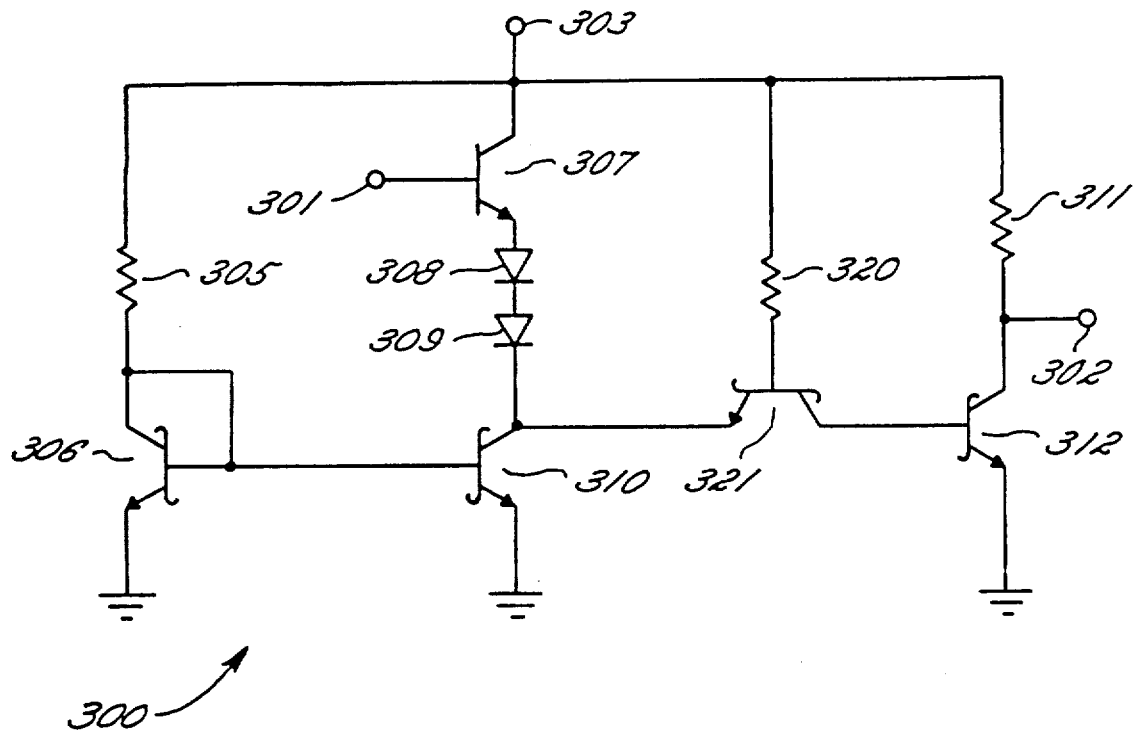
Figure 4:
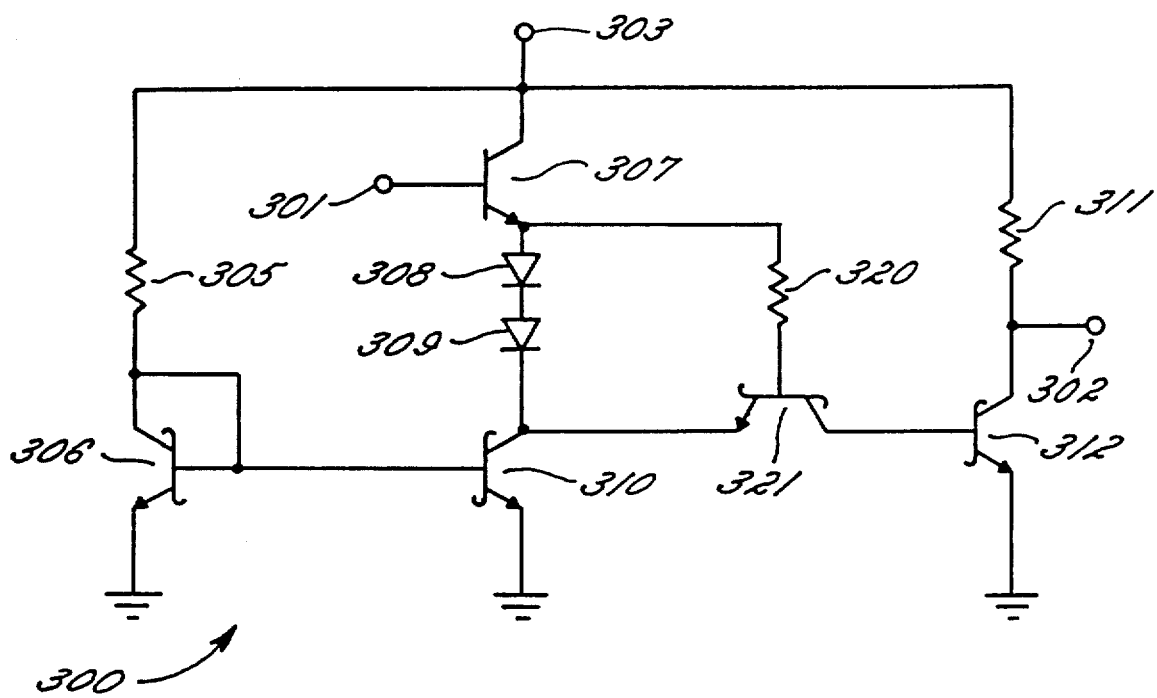

FIG. 4 is a schematic diagram of one embodiment of a sense amplifier constructed in accordance with the teachings of this invention. Sense amplifier 300 includes input terminal 301 (although a plurality of transistors 307 and input terminals 301 can be used as described with respect to the aforementioned FIGS. 1 and 2) for receiving an input signal to be sensed, and output terminal 302 for providing an output signal which is a function of the state of the input signal. Sense amplifier 300 also includes terminal 303 for receiving a positive supply voltage. Resistor 305 and transistor 306 form a biasing network which provides base drive to transistor 310. The emitter of transistor 307 is connected through series-connected diodes 308 and 309 to the collector of Schottky current steering transistor 310, and also through resistor 320 to the base of Schottky transistor 321. The emitter of Schottky transistor 321 is connected to the collector of transistor 310, and the collector of transistor 321 is connected to the base of output transistor 312.

The input signal applied to input terminal 301 is low when $V_{IN}$ is less than or equal to $$V_{LOW} = V_{307} + V_{308} + V_{309} - V_{321} + V_{Schottky} + V_{312};$$

where $V_{307}$ = the base emitter voltage of transistor 307;
$V_{308}$ = the forward bias voltage of diode 308;
$V_{309}$ = the forward bias voltage of diode 309;
$V_{321}$ = the base-emitter voltage of transistor 321;
$V_{Schottky}$ = the base-collector voltage of transistor 321; and
$V_{312}$ = the base-emitter voltage of transistor 321.
Since $V_{321} \simeq V_{312}$, then $$V_{LOW} = 3V_{be} + V_{Schottky}.$$

In this event, the base of output transistor 312 is connected from the collector to the emitter of transistor 321, and in turn from the collector of transistor 310 to the emitter of transistor 310, which in turn is connected to ground. Thus, the base of output transistor 312 is pulled low, output transistor 312 is off, and the output signal on output terminal 302 rises to the power supply voltage applied to terminal 303. In this state, it is only necessary for diodes 308 and 309 to be lightly forward biased, since the collector current of transistor 310 includes the current flowing through resistor 320 and the base-emitter junction of transistor 321.

When the input signal applied to input terminal 301 goes lower than $3V_{be} + V_{Schottky}$, the current provided by transistor 307, which transistor 310 must sink, decreases. The voltage drop across diodes 308 and 309, which are also in parallel with the base-emitter junction of transistor 321 and resistor 320, also decreases with the decrease in input voltage. As a result, there is essentially no current flow through diodes 308 and 309 and very little current flow through resistor 320.

The input signal applied to input terminal 301 is high when $V_{IN}$ is greater than $$V_{LOW} = 3V_{be} + V_{Schottky}$$

As $V_{IN}$ increases, the current through resistor 320 which is sunk by transistor 310 increases. This current is formed by base-emitter current through transistor 321, and base-collector Schottky feed around current which flows through the collector-emitter path of conducting transistor 321. Since transistor 310 sinks a fixed amount of current, the current supplied by diodes 308, 309 decreases. When the input voltage rises above $3V_{be} + V_{Schottky}$, the collector voltage of transistor 310 rises, causing the base-emitter junction of transistor 321 to cease being forward biased. In turn, the collector-emitter of transistor 321 turns off, and the Schottky feed-around current from the base to the collector of transistor 321 supplies base current to output transistor 312. At this time, the voltage drop across resistor 320 is equal to $$V_{320} = V_{IN} - (2V_{be} + V_{Schottky});$$

where $V_{IN}$ = the input voltage;
$V_{be}$ = the base-emitter voltages of transistors 307 and 312; and
$V_{Schottky}$ = the base-collector voltage of transistor 321.

Thus, transistor 321 acts as a very fast switch turning on transistor 312 (as a result of a transition from a logical 0 to a logical 1 input signal), in which case transistor 321 ceases operation in the active saturation mode (base-emitter junction forward biased) and begins operation in the inverse active saturation mode (base-collector junction forward biased).

The invention now being fully described, it will be apparent to one of ordinary skill in the art that many changes and modifications can be made thereto without departing from the spirit or scope of the appended claims.

What is claimed is:

1. A circuit comprising:
an input terminal for receiving an input signal;
an output terminal for providing an output signal as a function of said input signal;
output transistor means having a first current handling lead coupled to said output terminal, a second current handling lead coupled to a voltage supply, and a control lead;
control means connected between said input terminal and said output transistor means for applying a control signal to said control lead of said output transistor means in response to said input signal; and
means for actively discharging said control lead in response to an input signal of a first state, thereby causing said output transistor means to switch and causing said output signal to switch to a desired state in response to said input signal, wherein said means for actively discharging comprises a discharge transistor having a first current handling lead coupled to said control load of said output transistor means, a second current handling lead coupled to a current source, and a control lead which receives a control signal as a function of said input signal.

2. A circuit as in claim 1 wherein said discharge transistor comprises a bipolar transistor.

3. A circuit as in claim 1 wherein said discharge transistor comprises a Schottky bipolar transistor.

4. A circuit as in claim 1 wherein said discharge transistor operates in a first state wherein said discharge transistor is in the forward active mode of operation, thereby discharging said control lead of said output transistor and causing said output transistor and said output signal to have a first state, and in a second state wherein said discharge transistor is in the inverse active mode of operation, thereby charging said control lead of said output transistor and causing said output transistor and said output signal to have a second state.

5. A circuit as in claim 1 wherein said discharge transistor comprises an NPN transistor having a collector serving as said first current handling lead, an emitter serving as said second current handling lead, and a base serving as said control lead.

6. A circuit as in claim 5 wherein the base-emitter junction of said discharge transistor is forward biased in said first state, and the base-collector junction of said discharge transistor is forward biased in said second state.

7. A circuit as in claim 1 wherein said current source comprises a current source transistor.

8. A circuit as in claim 7 wherein said current source transistor comprises a Schottky transistor.

9. A circuit as in claim 8 wherein said current source transistor comprises a collector coupled to said second current handling lead of said discharge transistor, an emitter coupled to a voltage source, and a base coupled to a bias potential.

10. A circuit as in claim 9 wherein said collector of said current source transistor is also coupled to means for providing current as a function of said input signal.

11. A circuit as in claim 1 wherein said discharge transistor serves also as a portion of said control means.

* * * * *

UNITED STATES PATENT AND TRADEMARK OFFICE
CERTIFICATE OF CORRECTION

PATENT NO. : 4,845,442

DATED : July 4, 1989

INVENTOR(S) : Jay R. Chapin & Thomas M. Luich

Figure 3:
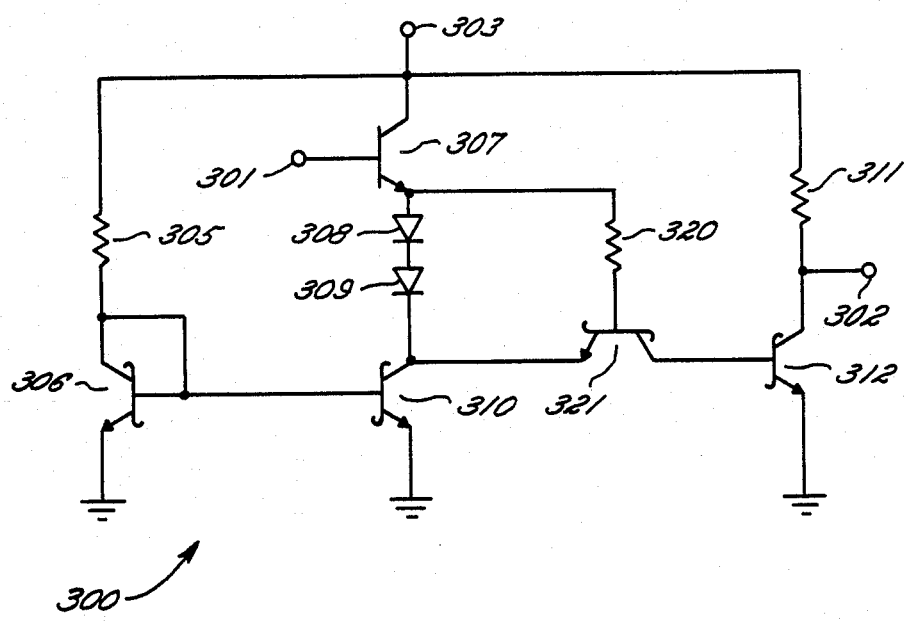
FIG. 3 is a schematic diagram of another prior art sense amplifier.

It is certified that error appears in the above-identified patent and that said Letters Patent is hereby corrected as shown below:

In Figure 3, delete the connection between resistor 320 and the emitter of transistor 307 and insert a connection between resistor 320 and terminal 303, as shown on the attached sheet containing Figures 3 and 4.

Signed and Sealed this

Fifteenth Day of May, 1990

Attest:

HARRY F. MANBECK, JR.

*Attesting Officer*  *Commissioner of Patents and Trademarks*